(12) United States Patent
Kato et al.

(10) Patent No.: US 7,012,308 B2
(45) Date of Patent: Mar. 14, 2006

(54) DIODE

(75) Inventors: Katsuhiro Kato, Tokyo (JP); Kenji Ichikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/736,706

(22) Filed: Dec. 17, 2003

(65) Prior Publication Data

US 2005/0012181 A1 Jan. 20, 2005

(30) Foreign Application Priority Data

Jul. 17, 2003 (JP) ............................... 2003-276183

(51) Int. Cl.
*H01L 23/62* (2006.01)
(52) U.S. Cl. ...................................... 257/360; 257/603
(58) Field of Classification Search ................ 257/603, 257/360, 355, 356, 173
See application file for complete search history.

(56) References Cited

U.S. PATENT DOCUMENTS 5,637,901 A * 6/1997 Beigel et al. ................ 257/355

FOREIGN PATENT DOCUMENTS

JP 8-316421 11/1996

OTHER PUBLICATIONS

S. Voldman et al., " Dynamic Threshold Body-and Gate-Coupled SOI ESD Protection Networks," EOS/ESD Sympostium 97-210, pp. 3A.2.1-3A2.11.

* cited by examiner

*Primary Examiner*—Sara Crane
(74) *Attorney, Agent, or Firm*—Volentine Francos & Whitt, PLLC (57) ABSTRACT

A diode which eliminates generation of local avalanche breakdown phenomenon when static surges in the backward direction are applied and withstands electrostatic breakdown. A P-type impurity diffused region of high concentration as an anode and an N-type impurity diffused region of high concentration as a cathode that surrounds the P-type impurity diffused region, are formed on the surface of an N-type silicon well region. The surface of the N-type silicon well region on which the impurity diffused regions are formed is covered with an interlayer dielectric, and a metal interconnect layer is formed thereon, to spread to the border line of the N-type impurity diffused region and is electrically connected to the P-type impurity diffused region. Accordingly, a P-type inversion layer IP is uniformly formed in a separation area between the impurity diffused regions when static surges in the backward direction are applied, preventing local avalanche breakdown.

19 Claims, 4 Drawing Sheets

DIODE

BACKGROUND OF THE INVENTION

1. Field of the Invention

The present invention relates to an electrostatic breakdown protection diode incorporated in a semiconductor integrated circuit device.

2. Description of the Related Art

Semiconductor integrated circuit devices have inherent weakness that the devices are easily destroyed when high-voltage static charge is applied to the devices from outside because of the structural feature that micro circuits are formed of thin insulating films having a thickness of a few to a few tens of nm and shallow impurity diffused layers having a thickness of a few hundreds of nm to a few tens of micrometers on a silicon substrate. To protect the circuits from the static charge, protection circuits in which a diode is connected in the backward direction against normal input/output signals are disposed between an input/output terminal (input terminal or output terminal) connected to the outside and power source and ground terminals.

More specifically, a $P^+N^-$-type diode which an anode is connected to the input/output terminal and a cathode is connected to the power source terminal is-connected between the input/output terminal and the power source terminal. Furthermore, a $P^-N^+$-type diode which a cathode is connected to the input/output terminal and an anode is connected to the ground terminal is connected between the input/output terminal and the ground terminal.

Figure 2A:
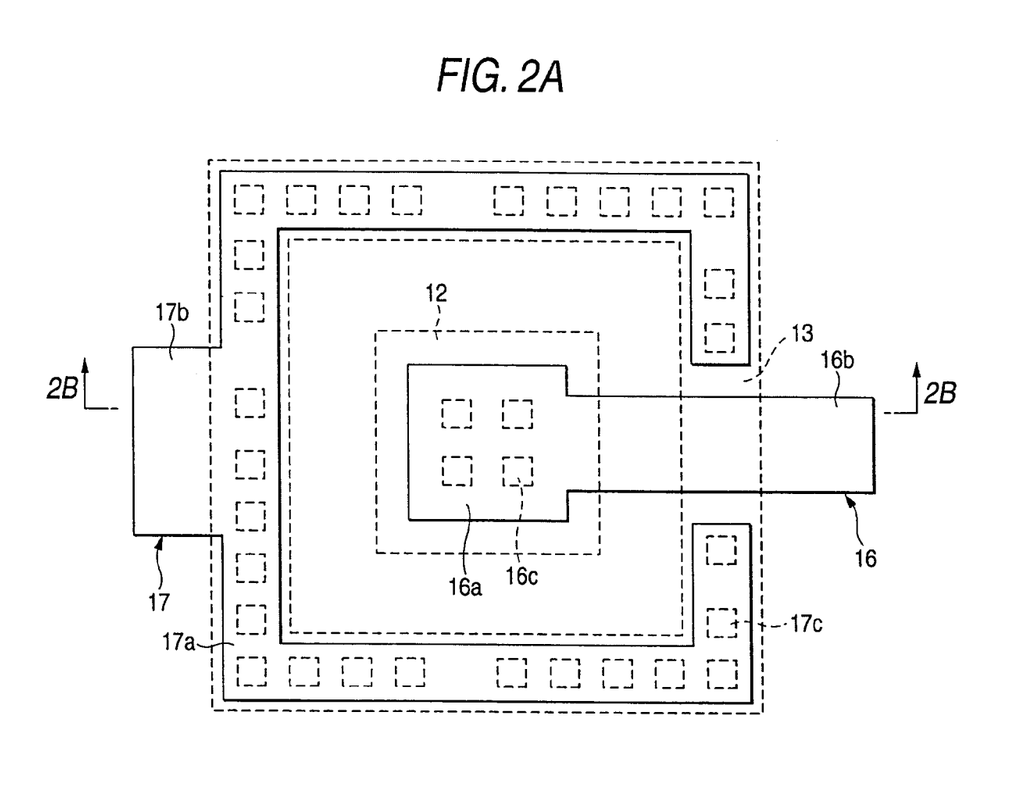
FIGS. 2A and 2B are diagrams illustrating the structure of a traditional electrostatic breakdown protection diode.
Figure 2B:
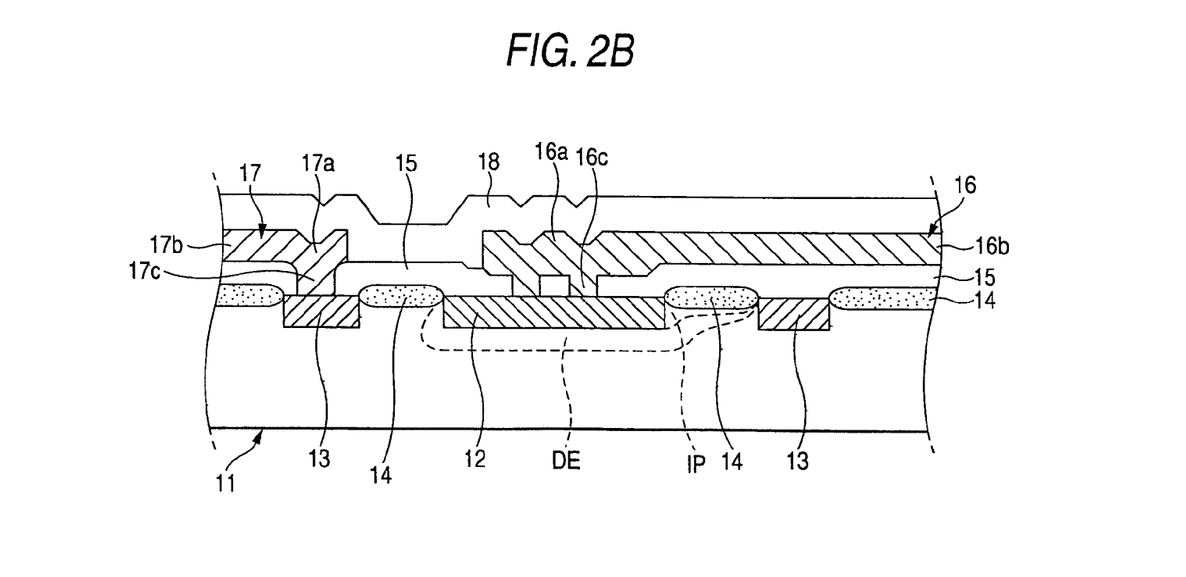

FIGS. 2A and 2B are diagrams illustrating the structure of a traditional electrostatic breakdown protection diode. FIG. 2A is a plan view, and FIG. 2B is a cross-sectional view along a line 2B—2B shown in FIG. 2A.

This diode is a typical $P^+N^-$-type connected between the input/output terminal and the power source terminal, which has a P-type impurity diffused region 12 of high concentration that is disposed on the front surface of an N-type silicon well region 11 of low concentration to form an anode and an N-type impurity diffused region 13 of high concentration that surrounds the P-type impurity diffused region 12 to form a cathode. A field oxide 14 is formed on the surfaces of a separation area for separating the P-type impurity diffused region 12 from the N-type impurity diffused region 13 and the N-type silicon well region 11 extend to outside of the N-type impurity diffused region 13. Moreover, an interlayer dielectric 15 covers the surfaces of the impurity diffused regions 12 and 13 and the field oxide 14. Metal interconnect layers 16 and 17 for connecting the anode to the input/output terminal and the cathode to the power source terminal, respectively, are formed on the interlayer dielectric 15.

The metal interconnect layer 16 has an anode part 16a corresponding to the P-type impurity diffused region 12 and formed smaller than that and an interconnect part 16b for connecting the anode part 16a to the input/output terminal. Furthermore, connecting metals 16c filled in a plurality of connecting holes disposed in the interlayer dielectric 15 connect between the anode part 16a and the P-type impurity diffused region 12.

The metal interconnect layer 17 has a belt-shaped cathode part 17a corresponding to the N-type impurity diffused region 13 and formed smaller than that and an interconnect part 17b for connecting the cathode part 17a to the power source terminal. However, a part of the cathode part 17a is cut out for avoiding intersecting with the interconnect part 16b of the metal layer 16. In addition, connecting metals 17c filled in a plurality of connecting holes disposed in the interlayer dielectric 15 connect between the cathode part 17a and the N-type impurity diffused region 13. Furthermore, an insulating film 18 is formed on the metal interconnect layers 16 and 17, and an interconnect layer, not shown, is formed thereon.

In addition, a typical $P^-N^+$-type diode connected between the input/output terminal and the ground terminal has a reverse conductive type of semiconductor having the same structure.

The provision of this electrostatic breakdown protection diode allows static surges to be released on the power source terminal side through the $P^+N^-$-type diode in the forward direction when positive static charge is applied to the input/output terminal. Moreover, static surges are released on the ground terminal side through the $P^-N^+$-type diode in the forward direction when negative static charge is applied to the input/output terminal. Accordingly, static charge is prevented from entering the inside and internal circuits are protected from electrostatic breakdown.

Patent document JP-A-8-316421

Non-patent document EOS/EDS SYMPOSIUM (1997), S. Voldman et al. Dynamic Threshold Body- and Gate-Coupled SOIESD Protection circuits pp. 210–220

SUMMARY OF THE INVENTION

The problem to be solved is that static surges are also applied to a $P^-N^+$-type diode connected between an input/output terminal and a ground terminal in the backward direction to destroy the $P^-N^+$-type diode during the period that positive static charge is applied to the input/output terminal and static surges are released on the power source terminal side through the $P^+N^-$-type diode in the forward direction, for example. Moreover, the $P^+N^-$-type diode in the backward direction is destroyed when negative static charge is applied to the input/output terminal.

The breakdown is considered to be generated by the following phenomenon.

For example, when negative static charge is applied to the input/output terminal, the diode shown in FIGS. 2A and 2B is in a state that a voltage in the backward direction is applied. Thus, the metal interconnect layer 16 is charged by the negative static charge at high potential, and a P-type inversion layer IP and a depletion layer DE are formed at the places right under the field oxide 14 extending between the N-type impurity diffused region 12 and the P-type impurity diffused region 13 in the lower part of the interconnect part 16b. In the meantime, since the lower part of the field oxide 14 without the metal interconnect layer 16 does not receive an electric field from the metal interconnect layer 16, the P-type inversion layer IP and the depletion layer DE are not formed therein.

A surge current is carried from the N-type impurity diffused region 12 to the P-type impurity diffused region 13 through the P-type inversion layer IP locally formed, which causes local avalanche breakdown. The avalanche breakdown abnormally heats a place where the surge current is carried in concentration, and the temperature rise permanently destroys the insulation.

The invention is to provide a diode that eliminates a local avalanche breakdown phenomenon when static surges in the backward direction are applied and has an excellent property to withstand electrostatic breakdown by an inventive structure of an electrostatic breakdown protection diode.

In aspects (1) and (2) of the invention, an electrostatic breakdown protection diode is configured to have:

a second conductive type impurity region formed by diffusing a second conductive type impurity of high concentration on a front surface of a silicon substrate having a first conductive type impurity of low concentration;

a first conductive type impurity region formed by diffusing a first conductive type impurity of high concentration on the front surface of the silicon substrate so as to surround the second conductive type impurity region with a predetermined width of a separation area apart from the second conductive type impurity region;

an interlayer dielectric formed so as to cover the front surface of the silicon substrate on which the first and second conductive type impurity regions are formed;

a first metal interconnect layer formed on the second conductive type impurity region and the separation area through the interlayer dielectric and electrically connected to the second conductive type impurity region through a connecting hole disposed the interlayer dielectric; and a second metal interconnect layer formed so as to almost fully cover the first conductive type impurity region through the interlayer dielectric and electrically connected to the first conductive type impurity region through a connecting hole disposed in the interlayer dielectric.

In addition, aspects (3) and (4) of the invention are that an electrode is formed on a front surface of a separation area between first and second conductive type impurity regions through an insulating film and the electrode is electrically connected to the second conductive type impurity region by the first metal interconnect layer.

In the diode according to aspects (1) and (2) of the invention, the first metal interconnect layer is configured so as to cover the separation area between the first and second conductive type impurity regions. Furthermore, in the diode according to aspects (3) and (4) of the invention, the electrode connected to the separation area at the same potential as that of the second-conductive type impurity region. Accordingly, there is an advantage that a uniform avalanche breakdown phenomenon is generated throughout the separation area to prevent permanent dielectric breakdown caused by concentrated avalanche breakdown when static surges in the backward direction are applied.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

A P-type impurity diffused region of high concentration to form an anode is formed on the front surface of an N-type silicon well region of low concentration, and an N-type impurity diffused region of high concentration to from a cathode is formed around the P-type impurity diffused region with a separation area having nearly uniform width placed in between. Furthermore, an electrode is formed on the front surface of the separation area through an insulating film, and a metal interconnect layer for anode is formed on the front surface through an interlayer dielectric and electrically connected to the P-type impurity diffused region and the electrode. Moreover, a metal interconnect layer for cathode is formed through the interlayer dielectric and electrically connected to the N-type impurity diffused region.

Embodiment 1

Figure 1A:
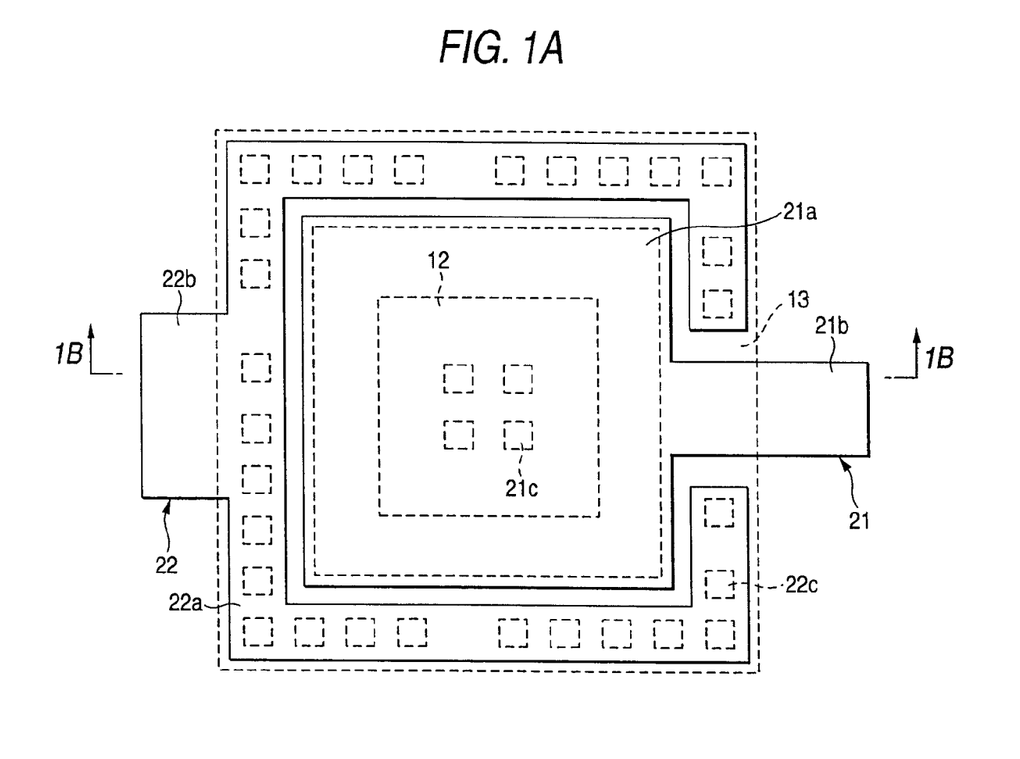
FIGS. 1A and 1B are structural diagrams of an electrostatic breakdown protection diode illustrating Embodiment 1 according to the invention.
Figure 1B:
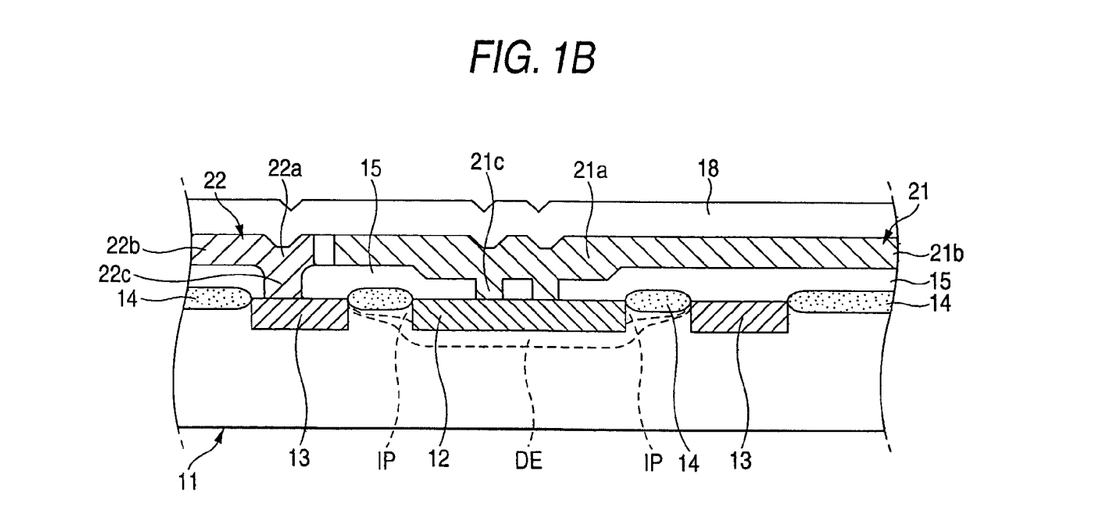

FIGS. 1A and 1B are structural diagrams of an electrostatic breakdown protection diode illustrating Embodiment 1 according to the invention. FIG. 1A is a plan view, and FIG. 1B is a cross-sectional view along a line 1B—1B shown in FIG. 1A. In addition, in FIGS. 1A and 1B, the same components as the components shown in FIGS. 2A and 2B are designated the same reference numerals and signs.

This diode is a $P^+N^-$-type connected between an input/output terminal and a power source terminal, which has a nearly square P-type impurity diffused region 12 of high concentration that is disposed on the front surface of an N-type silicon well region 11 of low concentration to form an anode, and an N-type impurity diffused region 13 of high concentration that surrounds the P-type impurity diffused region 12 at a nearly uniform interval to form a cathode. A field oxide 14 is formed on the surfaces of a separation area for separating the P-type impurity diffused region 12 from the N-type impurity diffused region 13 and the N-type silicon well region 11 outside the N-type impurity diffused region 13. Furthermore, the surfaces of the impurity diffused regions 12 and 13 and the field oxide 14 are covered with an interlayer dielectric 15. Metal interconnect layers 21 and 22 for connecting the anode to an input/output terminal and the cathode to a power source terminal, respectively, are formed on the interlayer dielectric 15.

The metal interconnect layer 21 has an anode part 21a formed in a large size so as to cover throughout the P-type impurity diffused region 12 and the separation area between the P-type impurity diffused region 12 and the N-type impurity diffused region 13 and an interconnect part 21b for connecting the anode part 21a to the input/output terminal. Moreover, connecting metals 21c filled in a plurality of connecting holes disposed in the interlayer dielectric 15 electrically connect between the anode part 21a and the P-type impurity diffused region 12.

In the meantime, the metal interconnect layer 22 has a square belt-shaped cathode part 22a corresponding to the N-type impurity diffused region 13 and formed smaller than that and an interconnect part 22b for connecting the cathode part 22a to the power source terminal. However, a part of one side of the cathode part 22a is cut out for avoiding intersecting with the interconnect part 21b of the metal layer 21. In addition, connecting metals 22c filled in a plurality of connecting holes disposed in the interlayer dielectric 15 electrically connect between the cathode part 22a and the N-type impurity diffused region 13. Furthermore, an insulating film 18 is formed on the metal interconnect layers 21 and 22, and an interconnect layer, not shown, is formed thereon.

The fabrication process steps of the diode in outline are as follows.

First, a silicon nitride film is formed on a silicon substrate, the nitride film in the places to form the field oxide 14 is removed by photolithography, and then a resist used in photolithography is removed. Subsequently, the areas where the nitride film is removed are thermally oxidized to form the field oxide 14 at predetermined positions.

Then, the areas other than the area to be the cathode are covered with a resist film by photolithography, and an N-type impurity of high concentration is injected to form the N-type impurity diffused region 13. Similarly, a P-type impurity of high concentration is injected into the area to be the anode, and the P-type impurity diffused region 12 is formed.

The interlayer dielectric 15 is formed over throughout the surface of the silicon substrate on which the field oxide 14, the P-type impurity diffused region 12 and the N-type impurity diffused region 13 are formed, and then a photo resist is applied to the surface of the interlayer dielectric 15 to form a resist pattern for opening the connecting holes by photolithography. The resist pattern is used to etch the interlayer dielectric 15 for opening the connecting holes.

Moreover, the photo resist is removed, the metal layer is formed over throughout the surface of the interlayer dielectric 15, and the metal layer is etched by photolithography to form the metal interconnect layers 21 and 22 for connecting to the input/output terminal and the power source terminal. The insulating film 18 is formed on the surfaces of the metal interconnect layers 21 and 22 to fabricate the diode shown in FIGS. 1A and 1B. In addition, after that, second and third metal interconnect layers are formed as required.

Next, the operation will be described.

When positive static charge is applied to the input/output terminal, a positive voltage is applied to the metal interconnect layer 21 and a negative voltage is applied to the metal interconnect layer 22 of the diode shown in FIGS. 1A and 1B. Accordingly, a voltage in the forward direction is applied between the P-type impurity diffused region 12 as the anode and the N-type impurity diffused region 13 as the cathode, and acceptable static surges are, absorbed with no problem.

In the meantime, when negative static charge is applied to the input/output terminal, the diode is in a state that a voltage in the backward direction is applied, and the metal interconnect layer 21 is charged at high potential by negative static charge. The metal interconnect layer 21 covers the entire field oxide 14 as the separation area between the P-type impurity diffused region 12 and the N-type impurity diffused region 13 through the inter layer dielectric 15. On this account, a P-type inversion layer IP and a depletion layer DE are uniformly formed along all four sides in the N-type silicon well region 11 under the field oxide 14 by a negative electric field caused by the static charge charged in the metal interconnect layer 21. Accordingly, current is carried through the P-type inversion layer IP formed throughout the separation area between the P-type impurity diffused region 12 and the N-type impurity diffused region 13, and uniform avalanche breakdown is generated.

As described above, in the diode of Embodiment 1, the anode part 21a of the metal interconnect layer 21 to be connected to the input/output terminal is configured to cover the entire P-type impurity diffused region 12 and the field oxide 14 for separating the P-type impurity diffused region 12 from the N-type impurity diffused region 13. Therefore, the P-type inversion layer IP and the depletion layer DE are formed uniformly in the N-type silicon well region 11 under the field oxide 14 when the static surges in the backward direction are applied, which allows uniform avalanche breakdown to be generated in the P-type inversion layer IP to eliminate the generation of a local avalanche breakdown phenomenon. Accordingly, there are advantages that abnormal heat generation caused by concentrated current is eliminated, permanent dielectric breakdown is not generated, and excellent properties to withstand electrostatic breakdown can be obtained.

Embodiment 2

Figure 3A:
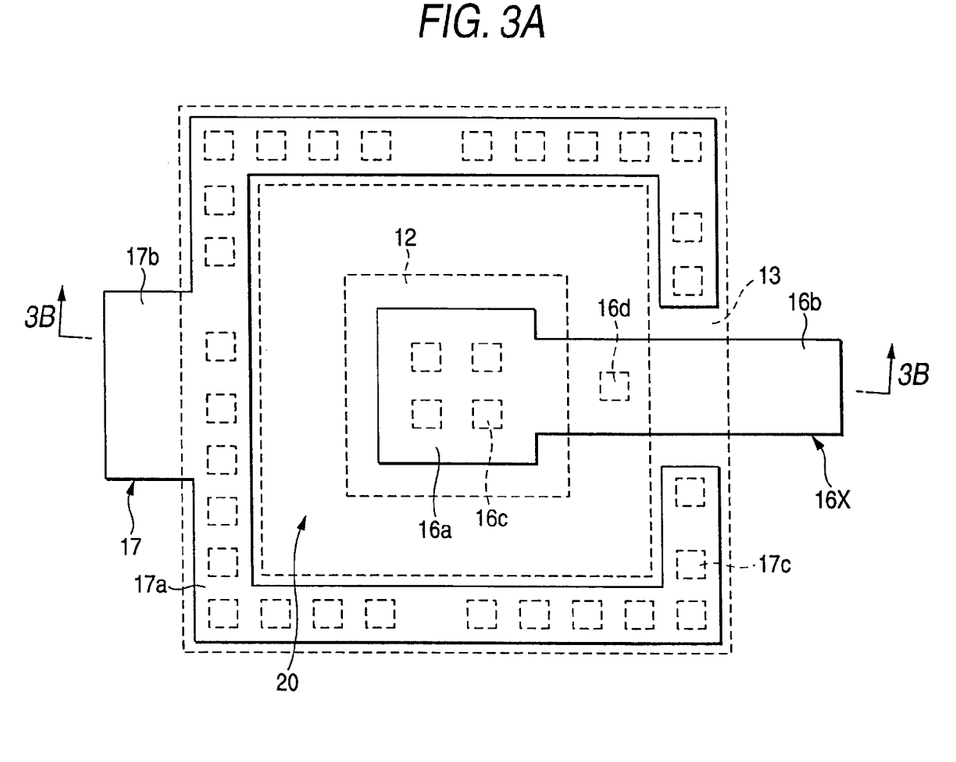
FIGS. 3A and 3B are structural diagrams of an electrostatic breakdown protection diode illustrating Embodiment 2 according to the invention.
Figure 3B:
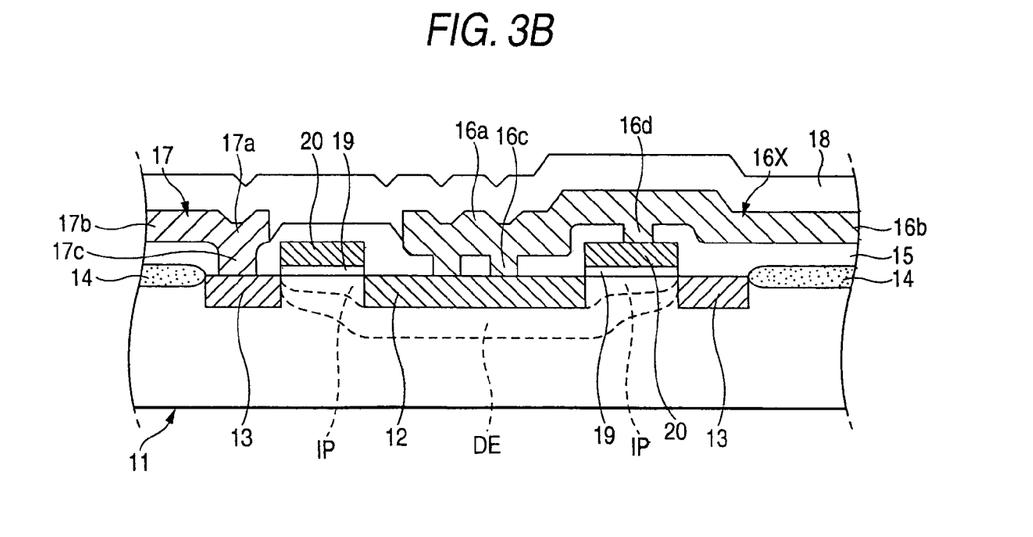

FIGS. 3A and 3B are structural diagrams of an electrostatic breakdown protection diode illustrating Embodiment 2 according to the invention. FIG. 3A is a plan view, and FIG. 3B is a cross-sectional view along a line 3B—3B shown in FIG. 3A. In addition, in FIGS. 3A and 3B, the same components as the components shown in FIGS. 2A and 2B are designated the same reference numerals and signs.

As similar to the diode shown in FIGS. 2A and 2B, this diode is a $P^+N^-$-type connected between an input/output terminal and a power source terminal, in which a P-type impurity diffused region 12 and an N-type impurity diffused region 13 are formed on the surface of an N-type silicon well region 11. A belt-shaped polysilicon electrode 20 is formed throughout the surface of a separation area for separating the P-type impurity diffused region 12 from the N-type impurity diffused region 13 through an oxide film 19, and a field oxide 14 is formed on the surface of the N-type silicon well region 11 outside the N-type impurity diffused region 13.

Furthermore, the surfaces of the impurity diffused regions 12 and 13, the polysilicon electrode 20 and the field oxide 14 are covered with an interlayer dielectric 15. A metal interconnect layer 16X for connecting an anode and the polysilicon electrode 20 to the input/output terminal and a metal interconnect layer 17 for connecting a cathode to the power source terminal are formed on the interlayer dielectric 15.

The metal interconnect layer 16X has an anode part 16a corresponding to the P-type impurity diffused region 12 and formed smaller than that and an interconnect part 16b for connecting the anode part 16a to the input/output terminal. In addition, connecting metals 16c filled in a plurality of connecting holes disposed in the interlayer dielectric 15 connect between the anode part 16a and the P-type impurity diffused region 12. Moreover, the interconnect part 16b is connected to the polysilicon electrode 20 by a connecting metal 16d filled in a connecting hole disposed in the interlayer dielectric 15.

The metal interconnect layer 17 has a belt-shaped cathode part 17a corresponding to the N-type impurity diffused region 13 and formed smaller than that and an interconnect part 17b for connecting the cathode part 17a to the power source terminal. However, a part of the cathode part 17a is cut out for avoiding intersecting with the interconnect part 16b of the metal layer 16. Moreover, connecting metals 17c filled in a plurality of connecting holes disposed in the interlayer dielectric 15 connect between the cathode part 17a and the N-type impurity diffused region 13. In addition, an insulating film 18 is formed on the metal interconnect layers 16 and 17, and an interconnect layer, not shown, is formed thereon.

The fabrication process steps of the diode in outline are as follows.

First, a silicon nitride film is formed on a silicon substrate, the nitride film in the area to form the field oxide 14 is removed by photolithography, and a resist used in photolithography is removed. Subsequently, the area where the nitride film is removed is thermally oxidized to form the field oxide 14 at a predetermined position.

Then, an oxide film and a polysilicon layer are sequentially formed in the area to form the diode, and the oxide film 19 and the polysilicon electrode 20 are formed by patterning with photolithography. Subsequently, the areas other than the area to be the cathode are covered with a resist pattern by photolithography, and an N-type impurity of high concentration is injected to form the N-type impurity diffused region 13. Similarly, a P-type impurity of high concentration is injected into the area to be the anode, and the P-type impurity diffused region 12 is formed.

The interlayer dielectric 15 is formed throughout the surface of the silicon substrate on which the field oxide 14, the polysilicon electrode 20, the P-type impurity diffused region 12 and the N-type impurity diffused region 13 are formed, and then a photoresist is applied to the surface of the interlayer dielectric 15 to form a resist pattern for opening the connecting holes by photolithography. The process steps after that are the same as those in Embodiment 1.

Next, the operation will be described.

When positive static charge is applied to the input/output terminal, a positive voltage is applied to the metal interconnect layer 16X and a negative voltage is applied to the metal interconnect layer 17. Accordingly, a voltage in the forward direction is applied between the P-type impurity diffused region 12 as the anode and the N-type impurity diffused region 13 as the cathode, and acceptable static surges are absorbed with no problem.

In the meantime, when negative static charge is applied to the input/output terminal, the diode is in a state that a voltage in the backward direction is applied, and the metal interconnect layer 16X is charged at high potential by negative static charge. Since the metal interconnect layer 16X is connected to the polysilicon electrode 20 through the connecting metal 16d, the polysilicon electrode 20 is also charged at high potential by negative static charge. Therefore, a P-type inversion layer IP and a depletion layer DE are uniformly formed along all-four sides in the N-type silicon well region 11 under the oxide film 19 by a negative electric field caused by the static charge charged in the polysilicon electrode 20. Accordingly, current is carried through the P-type inversion layer IP formed throughout the junction part of the P-type impurity diffused region 12 to the N-type impurity diffused region 13, and uniform avalanche breakdown is generated.

As described above, in the diode of Embodiment 2, the polysilicon electrode 20 is disposed in the separation area for separating the P-type impurity diffused region 12 from the N-type impurity diffused region 13 through the oxide film 19, and the polysilicon electrode 20 is connected to the metal interconnect layer 16X. Accordingly, the P-type inversion layer IP and the depletion layer DE are uniformly formed in the N-type silicon well region 11 as the separation area when static surges in the backward direction are applied, allowing the same advantages as Embodiment 1 to be obtained.

Furthermore, the oxide film 19 can be formed significantly thinner than the field oxide 14 and the interlayer dielectric 15 in FIG. 1 (for example, the oxide film 19 is in a thickness of about 10 nm, and the field oxide 14 and the interlayer dielectric 15 are in a thickness of about 600 nm). Accordingly, the P-type inversion layer IP deeper than that in FIG. 1 can be formed, the current density of the static surges carried through the P-type inversion layer IP is reduced, and more excellent properties to withstand electrostatic breakdown can be obtained.

Embodiment 3

Figure 4A:
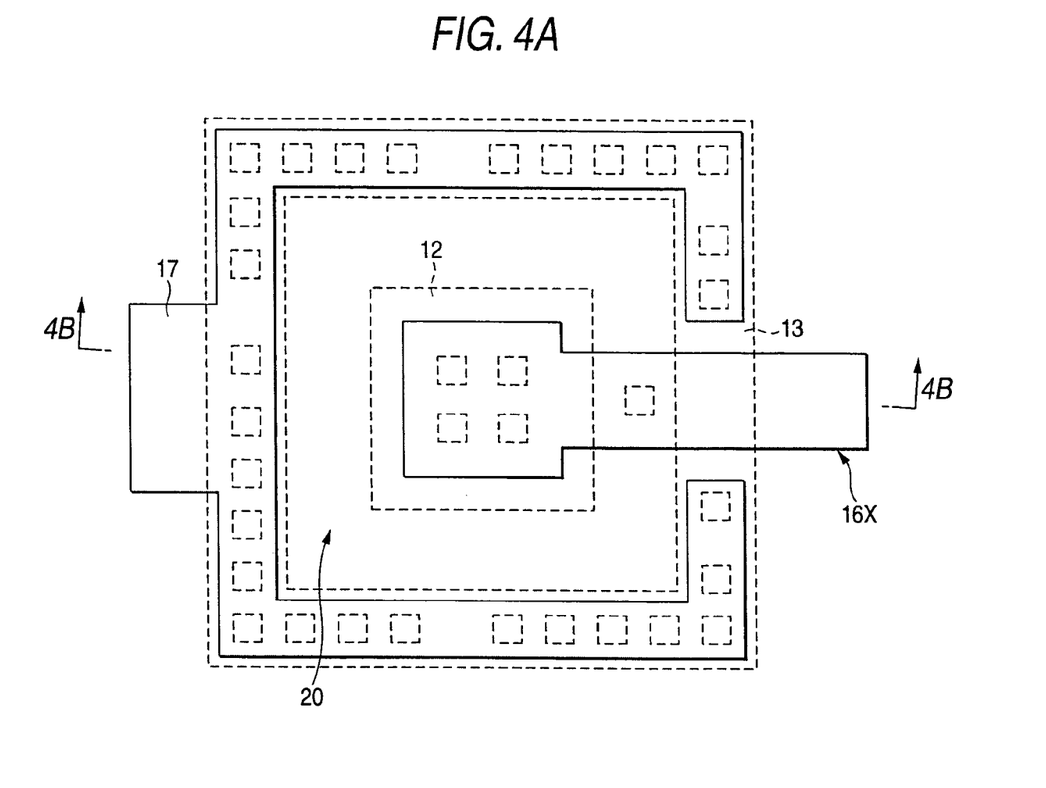
FIGS. 4a and 4B are structural diagrams of an electrostatic breakdown protection diode illustrating Embodiment 3 according to the invention.
Figure 4B:
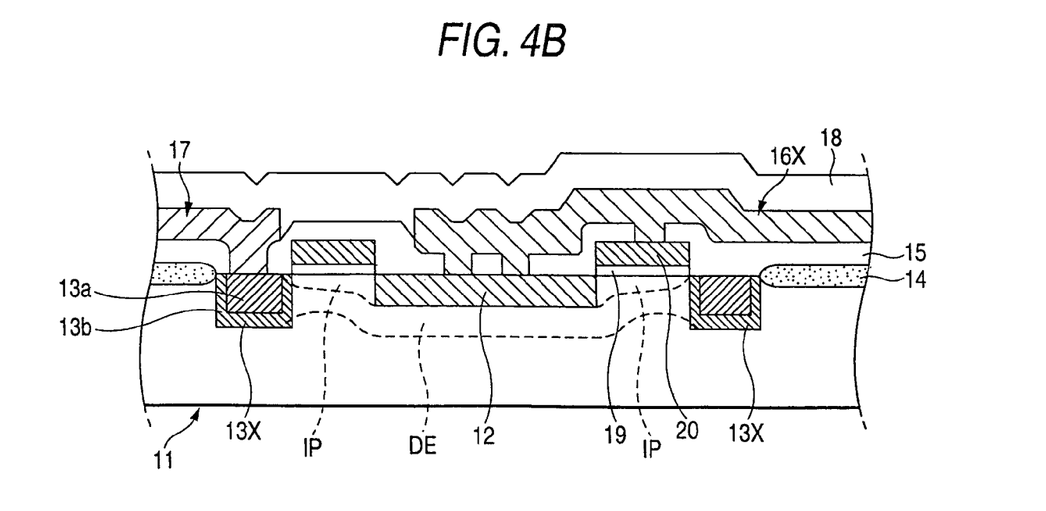

FIGS. 4A and 4B are structural diagrams of an electrostatic breakdown protection diode illustrating Embodiment 3 according to the invention. FIG. 4A is a plan view, and FIG. 4B is a cross-sectional view along a line 4B—4B shown in FIG. 4A. In addition, in FIGS. 4A and 4B, the same components as the components shown in FIGS. 3A and 3B are designated the same reference numerals and signs.

In this diode, an N-type impurity diffused region 13X having a slightly different structure is provided instead of the N-type impurity diffused region 13 shown in FIGS. 3A and 3B. More specifically, the N-type impurity diffused region 13X has a double structure in which an N-type impurity diffused region 13a of high concentration is disposed inside and an N-type impurity diffused region 13b of low concentration is disposed outside. Therefore, the structure is provided that a polysilicon electrode 20 is separated from the N-type impurity diffused region 13a of high concentration at a predetermined distance by the N-type impurity diffused region 13b of low concentration. Then, connecting metals 17c filled in a plurality of connecting holes disposed in an interlayer dielectric 15 connect between the N-type impurity diffused region 13a of high concentration and a cathode part 17a of a metal interconnect layer 17. The other configurations are the same as those in FIG. 1.

The fabrication process steps of the diode in outline are as follows.

First, a silicon nitride film is formed on a silicon substrate, the nitride film in the area to form a field oxide 14 is removed by photolithography, and a resist used in photolithography is removed. Subsequently, the area where the nitride film is removed is thermally oxidized to form the field oxide 14 at a predetermined position. And, an oxide film and a polysilicon layer are sequentially formed in the area to form the diode, and then an oxide film 19 and the polysilicon electrode 20 are formed by patterning with photolithography.

Then, the areas other than the area to be the cathode are covered with a resist pattern by photolithography, and an N-type impurity of low concentration is injected into the area to be the cathode. Subsequently, the areas other than the area to be the N-type impurity diffused region 13a of high concentration are covered with a resist pattern, and an N-type impurity of high concentration is injected. Therefore, the N-type impurity diffused region 13X formed of the N-type impurity diffused region 13a of high concentration and the N-type impurity diffused region 13b of low concentration is formed. Furthermore, the areas other than the area to be the anode are covered with a resist pattern by photolithography, and a P-type impurity of high concentration is injected into the area to be the anode, and the P-type impurity diffused region 12 is formed.

The interlayer dielectric 15 is formed throughout the surface of the silicon substrate on which the field oxide 14, the polysilicon electrode 20, the P-type impurity diffused region 12 and the N-type impurity diffused region 13X are formed, and a photo resist is applied to the surface of the interlayer dielectric 15 to form a resist pattern for opening the connecting holes by photolithography. The process steps after that are the same as those in Embodiment 1. The operation of the diode is almost the same as the operation of the diode of Embodiment, 2.

However, when a voltage in the backward direction, that is, negative static charge is applied to the input/output terminal, a P-type inversion layer IP and a depletion layer DE formed in the N-type silicon well region 11 under the oxide film 19 are spread to the inside of the N-type impurity diffused region 13b of low concentration as shown in FIG. 4B. Therefore, the place of PN junction is moved to the border part between the N-type impurity diffused region 13a of high concentration and the N-type impurity diffused region 13b of low concentration. Accordingly, the place of PN junction is to be formed in the place apart from the oxide film 19 and the polysilicon electrode 20.

As described above, in the diode of Embodiment 3, the polysilicon electrode 20 is disposed in the separation area for separating the P-type impurity diffused region 12 from the N-type impurity diffused region 13X through the oxide film 19, and the polysilicon electrode 20 is connected to a metal interconnect layer 16X. Accordingly, the same advantages of Embodiment 2 can be obtained.

Moreover, the N-type impurity diffused region 13X is formed to have the, double structure formed of the inside N-type impurity diffused region 13a of high concentration and the outside N-type impurity diffused region 13b of low concentration, and the N-type impurity diffused region 13a of high concentration is separated from the polysilicon electrode 20 at a predetermined distance. Accordingly, the place of PN junction formed when a voltage in the backward direction is applied is separated from the oxide film 19 and the polysilicon electrode 20. Thus, permanent breakdown of the oxide film 19 caused by the static surges is suppressed, and more excellent properties to withstand electrostatic breakdown can be obtained.

In addition, since the same fabrication process steps as those of the traditional high-voltage transistor that is fabricated by diffusing an impurity of high concentration inside an impurity region of low concentration can be used for the diode, the diode has an advantage that it is unnecessary to add special process steps in fabrication.

As examples to utilize the invention, the following is named.

(a) The $P^+N^-$-type diode connected between the input/output terminal and the power source terminal has been described, but a $P^-N^+$-type diode connected between the input/output terminal and the ground terminal can be configured by reversing the conductive type of semiconductor.

(b) The shape of the P-type impurity diffused region 12 has been described to be square, but it is fine to form into a rectangular or circular shape.

(c) The anode part 21a of the metal interconnect layer 21 shown in FIGS. 1A and 1B is nearly square so as to cover the entire P-type impurity diffused region 12 and separation area. However, the anode part 21a unnecessarily cover the entire P-type impurity diffused region 12 and separation area; the shape is fine that fully covers the border part between the N-type impurity diffused region 13 and the separation area.

What is claimed is:

1. A protection diode comprising:
   a silicon substrate of a first conductive type;
   a second conductive type impurity region on a surface of the silicon substrate;
   a first conductive type impurity region on the surface of the silicon substrate so as to surround the second conductive type impurity region, the first and second conductive type impurity regions being separated from each other by a separation area having a predetermined width, the separation area including an entirety of the area between the first and second conductive type impurity regions;
   an interlayer dielectric layer formed so as to cover the surface of the silicon substrate on which the first and second conductive type impurity regions are formed;
   a first metal interconnect layer formed over an entirety of the second conductive type impurity region and the separation area through the interlayer dielectric layer and electrically connected to the second conductive type impurity region through a first connecting hole formed in the interlayer dielectric layer; and
   a second metal interconnect layer formed so as to cover the first conductive type impurity region through the interlayer dielectric layer and electrically connected to the first conductive type impurity region through a second connecting hole formed in the interlayer dielectric layer.

2. The protection diode according to claim 1, wherein the first metal interconnect layer is formed so as to fully cover a border area between the first conductive type impurity region and the separation area through the interlayer dielectric layer.

3. A protection diode comprising:
   a silicon substrate of a first conductive type;
   a second conductive type impurity region formed on a surface of the silicon substrate;
   a first conductive type impurity region formed on the surface of the silicon substrate so as to surround the second conductive type impurity region and being a predetermined width of a separation area apart from the second conductive type impurity region;
   an insulating film formed on almost an entirety of the separation area of the silicon substrate;
   an electrode layer formed on the insulating film;
   an interlayer dielectric layer formed so as to cover the surface of the silicon substrate on which the first and second conductive type impurity regions and the electrode layer are formed;
   a first metal interconnect layer formed on the second conductive type impurity region through the interlayer dielectric layer and electrically connected to the second conductive type impurity region and the electrode layer through a first connecting hole formed in the interlayer dielectric layer; and
   a second metal interconnect layer formed so as to cover the first conductive type impurity region through the interlayer dielectric layer and electrically connected to the first conductive type impurity region through a second connecting hole formed in the interlayer dielectric layer.

4. The protection diode according to claim 3, wherein the first conductive type impurity region includes a high concentration impurity region and a low concentration impurity region surrounding the high concentration impurity region.

5. The protection diode according to claim 1, wherein the silicon substrate has a well region of the first conductive type, and the first and second conductive type impurity regions are formed on the well region.

6. The protection diode according to claim 3, wherein the silicon substrate has a well region of the first conductive type, and the first and second conductive type impurity regions are formed on the well region.

7. The protection diode according to claim 1, further comprising an isolation region formed on the surface of the silicon substrate so as to surround the first and second conductive type impurity regions.

8. The protection diode according to claim 3, further comprising an isolation region formed on the surface of the silicon substrate so as to surround the first and second conductive type impurity regions.

9. The protection diode according to claim 1, wherein the first and second metal interconnect layers are formed from a same conductive layer.

10. The protection diode according to claim 3, wherein the first and second metal interconnect layers are formed from a same conductive layer.

11. The protection diode according to claim 1, wherein one of the first and second metal interconnect layers is connected to a fixed voltage, and another of the first and second metal interconnect layers is connected to an input terminal.

12. The protection diode according to claim 3, wherein one of the first and second metal interconnect layers is connected to a fixed voltage, and another of the first and second metal interconnect layers is connected to an input terminal.

13. A protection diode comprising:
a semiconductor substrate of a first conductivity type;
a first impurity region of a second conductivity type that is opposite to the first conductivity type;
a separation area of the semiconductor substrate surrounding the first impurity region;
a second impurity region of the first conductivity type, the second impurity region surrounding the separation area;
an insulating layer formed on the first and second impurity regions and the separation area;
an electrode layer formed on the insulating layer, the electrode layer substantially covering an entire area of the separation area;
a first conductive pattern electrically connected to the first impurity region and the electrode layer; and
a second conductive pattern electrically connected to the second impurity region.

14. The protection diode according to claim 13, wherein an inversion layer is formed on a surface of the separation area when a static charge is applied to the first conductive pattern.

15. The protection diode according to claim 13, wherein one of the first and second conductive patterns is connected to a fixed voltage, and another of the first and second conductive patterns is connected to an input terminal.

16. The protection diode according to claim 13, wherein the semiconductor substrate has a well region of the first conductivity type, and the first and second impurity regions are formed on the well region.

17. The protection diode according to claim 13, wherein the first and second conductive patterns are formed from a same conductive layer.

18. The protection diode according to claim 17, wherein the electrode layer and the conductive layer of the first and second conductive patterns are different layers.

19. The protection diode according to claim 13, further comprising an isolation region formed on a surface of the semiconductor substrate so as to surround the first and second impurity regions.

* * * * *